United States Patent
Durham et al.

(10) Patent No.: US 6,252,418 B1
(45) Date of Patent: *Jun. 26, 2001

(54) REDUCED AREA ACTIVE ABOVE-SUPPLY AND BELOW-GROUND NOISE SUPPRESSION CIRCUITS

(75) Inventors: Christopher McCall Durham; Peter Juergen Klim; Shon Alan Schmidt, all of Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/404,401

(22) Filed: Sep. 23, 1999

Related U.S. Application Data

(63) Continuation-in-part of application No. 09/282,269, filed on Mar. 31, 1999, now Pat. No. 6,181,156.

(51) Int. Cl.[7] ............................ H03K 17/16; H03K 5/08
(52) U.S. Cl. ................... 326/27; 326/26; 326/28; 326/31; 326/86; 326/87; 327/310; 327/312
(58) Field of Search .................... 326/26, 27, 28, 326/31, 86, 87; 327/34, 310, 312, 316, 321, 323

(56) References Cited

U.S. PATENT DOCUMENTS

| | | | |
|---|---|---|---|
| 5,065,048 | * 11/1991 | Asai et al. | 307/443 |
| 5,646,557 | * 7/1997 | Runyon et al. | 326/97 |
| 5,734,277 | * 3/1998 | Hu et al. | 327/108 |
| 5,793,226 | * 8/1998 | Park et al. | 326/86 |
| 5,933,021 | * 8/1999 | Mohd | 326/30 |

* cited by examiner

*Primary Examiner*—Patrick Wamsley
*Assistant Examiner*—Vibol Tan
(74) *Attorney, Agent, or Firm*—Duke W. Yee; Robert M. Carwell

(57) ABSTRACT

A noise suppression circuit for suppressing noises above and below reference voltages is provided. The noise suppression circuit for suppressing noises includes a clamping transistor, a feedback circuit, and a presetting means for presetting an internal latch of the noise suppression circuit to a predetermined state. The predetermined state is a high state or a low state depending upon the type of noise suppression accomplished by the circuit. After the occurrence of a noise coupling event, the clamping transistor restores the state of a data input of a circuit to which the suppression circuit is providing protection. The feedback circuit then turns off the clamping transistor after a predetermined amount of time.

26 Claims, 7 Drawing Sheets

US 6,252,418 B1

REDUCED AREA ACTIVE ABOVE-SUPPLY AND BELOW-GROUND NOISE SUPPRESSION CIRCUITS

CROSS-REFERENCE TO RELATED APPLICATIONS

The present application is a continuation-in-part of the application entitled "Noise Suppression Circuits for Suppressing Noises Above and Below Reference Voltages", U.S. application Ser. No. 09/282,269, filed Mar. 31, 1999, now U.S. Pat. No. 6,181,156, assigned to the same assignee.

BACKGROUND OF THE INVENTION

1. Technical Field

The present invention relates to electronic circuits, and in particular, to electronic noise suppression circuits.

2. Description of Related Art

As engineers seek ever increasing speeds in VLSI chips, complex problems continue to rise to the forefront. For example, as process feature sizes continue to shrink, metallurgical limitations are continually raising line-to-line interconnect coupling effects, leading to increased concern over signal noise and noise tolerances. Design engineers continually fight and solve problems relating to signal noise.

Signal noise can take several forms. Due to coupling effects, signals can bounce in one or more of four distinct directions: above ground, below the supply, below ground, and above the supply. Above-ground signal noise and below-supply signal noise can cause false switching events if the coupling effects cause a signal to cross the switching threshold of a given destination circuit. Below-ground signal noise and above-supply signal noise can cause loss of state in some types of latch circuits.

Therefore, it would be advantageous to provide an active circuit that can reduce noise effects, such as those produced by line-to-line interconnect coupling, and it would be particularly advantageous to provide an active circuit to reduce above-supply signal noise and below-ground signal noise.

SUMMARY OF THE INVENTION

A noise suppression circuit for suppressing noises above and below reference voltages is provided. The noise suppression circuit for suppressing noises includes a clamping transistor, a feedback circuit, and a presetting means for presetting an internal latch of the noise suppression circuit to a predetermined state. The predetermined state is a high state or a low state depending upon the type of noise suppression accomplished by the circuit. After the occurrence of a noise coupling event, the clamping transistor restores the state of a data input of a circuit to which the suppression circuit is providing protection. The feedback circuit then turns off the clamping transistor after a predetermined amount of time.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION OF THE PREFERRED EMBODIMENT

Various effects can result from noise coupling effects as well. As aforementioned, above ground and below supply noise coupling can cause a false switching event at a destination circuit. Additionally, line-to-line coupling can cause and increased effective load capacitance if neighboring nets switch opposite directions while a signal tries to switch, resulting in increased delay time through the interconnecting wire. Furthermore, in certain cases, below-ground and above-supply coupling events can cause a loss of state in certain types of circuits.

Figure 1:
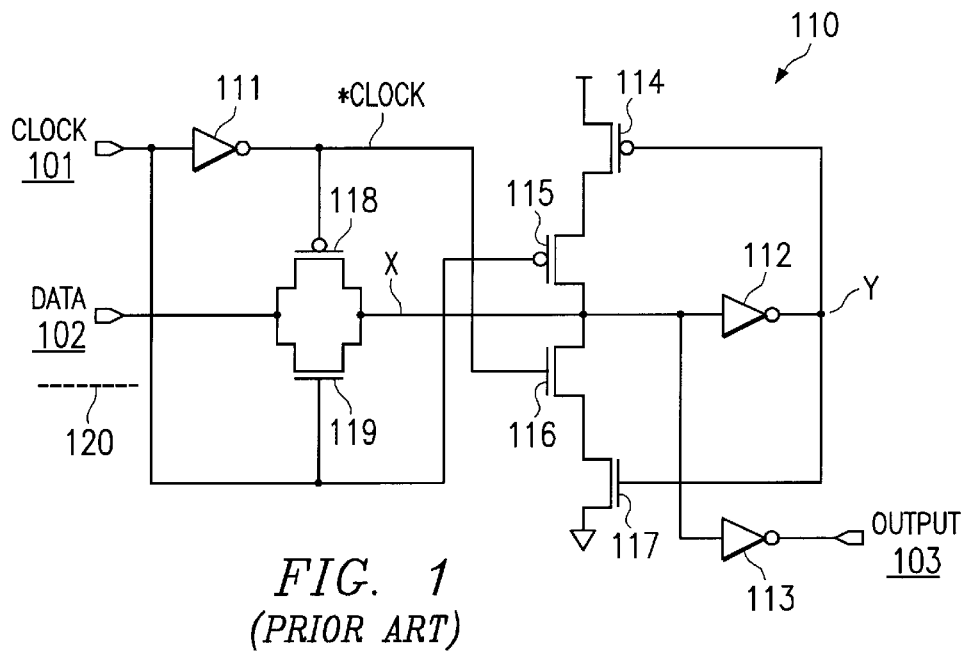
FIG. 1 is a circuit diagram of a conventional latch circuit.

With reference now to FIG. 1, a conventional latch circuit is shown. Latch circuit 110 includes inverters 111–113 and transistors 114–119. Latch circuit 110 also includes clock signal 101, data input 102, and output 103. Typically, when the clock signal is low, the state of the data input is stored in node X. When the clock signal is high, the state of node X (i.e., the previous state of the data input) is allowed to pass through to the output (with an inversion).

For example, when the clock signal is high, then inverter 111 causes the *clock signal to be low. Both p-channel transistor 118 and n-channel transistor 119 are then turned on, which allows the data signal to propagate to node X. P-channel transistor 118 and n-channel transistor 119 may be p-channel metal oxide semiconductor (PMOS) and n-channel metal oxide semiconductor (NMOS) transistors, respectively. Additionally, the high clock signal turns off p-channel transistor 115 and the low *clock signal turns off n-channel transistor 116, breaking the feedback loop from node Y to node X. Thus, inverter 112 forces the inverted state on node X to be seen on node Y, and in parallel, inverter 113 causes the inverted state of node X to propagate to the output.

When the clock signal is low, the *clock signal is high via inverter 111, turning off both p-channel transistor 118 and n-channel transistor 119. This isolates the input data signal from node X. Because the clock signal is low and the *clock signal is high, transistors 115 and 116 are now turned on. If, at this time, node Y is low (meaning node X was in a high state prior to the clock signal going low), p-channel transistor 114 turns on, providing a feedback loop from node Y to node X to maintain the high value at node X. Similarly, if node Y is high, then n-channel transistor 117 turns on, providing a feedback loop from node Y to node X to maintain a low state at node X. Note that the output will follow node X via inverter 113. In this way, the logical state of the data input is stored at node X and appears at the output while the clock signal is low.

The logical state at node X will usually remain the same until the clock signal goes high again. However, in certain noise coupling situations, the state of node X can be lost. For example, if node X is at a high state (so the output is in a low state) while the clock signal is low, then n-channel transistor 119 is turned off. Even if the data input goes low at this time, the high state at node X can still be maintained because there is no path connected between node X and the data input. But if a signal line 120 now quickly transitions to a low state, the data input will be noise coupled below ground. At this point, if the gate-to-source voltage on "data" is above the threshold during the noise coupling, then n-channel transistor 118 will be turned on briefly. Furthermore, if the amplitude of the noise coupled voltage (typically set by the value of the coupling capacitance, the transition time of the coupling neighbor signal line 120, and the strength of the pull-down circuit on the data input) and its duration/resulting width (determined by the RC time constant of the data input signal line) are sufficient, the high value in node X of the latch may be forced low, which would mean that the latched state of latch circuit 110 has been lost.

With reference now to FIGS. 2A–2E, waveform diagrams depict simulation results of protected and unprotected signals. As previously noted, a first signal line may introduce noise to a second signal line through a coupling effect. For example, in FIG. 1, signal 120 may introduce noise to data input signal 102 through a coupling effect.

Figure 2A:
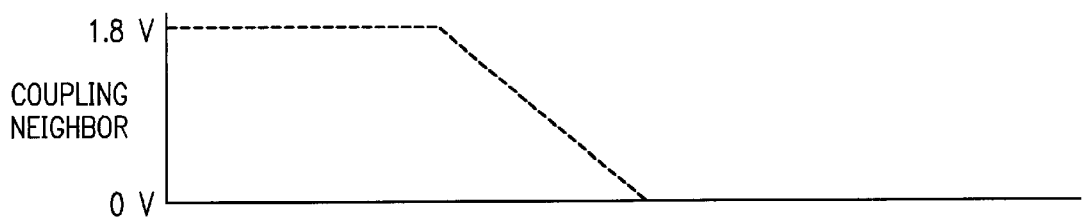
FIGS. 2A–2E are waveform diagrams depicting various simulation results of protected and unprotected signals.
Figure 2B:
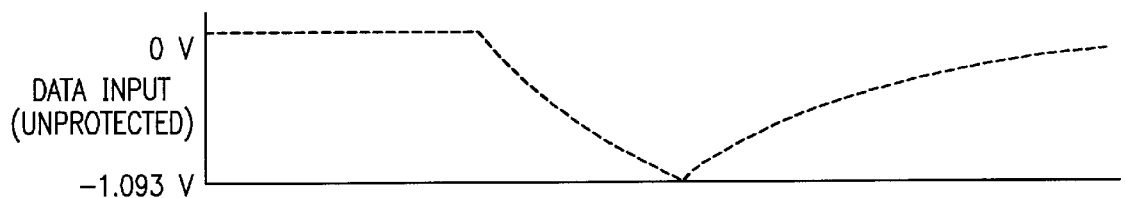
Figure 2C:
Figure 2D:
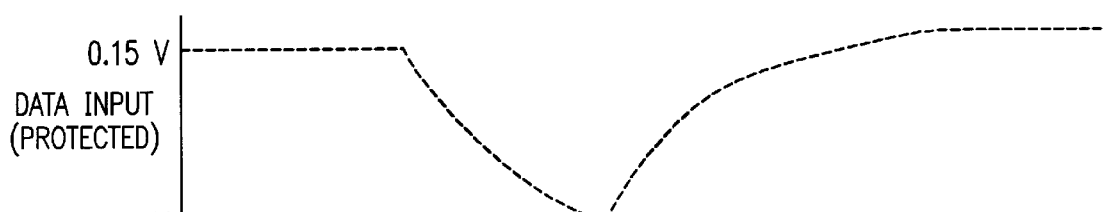

Consider the simulation results in FIGS. 2A–2C for a sample 1.8 V process. When a coupling signal switches to a low state, as shown in FIG. 2A, an unprotected data input may bounce below ground, as shown in FIG. 2B. The output of a conventional latch circuit, such as latch circuit 110 shown in FIG. 1, would transition to a high state errantly, as shown in FIG. 2C, due to the loss of the high state stored in the latch circuit, such as node X. In a similar fashion, the output of latch circuit 110 can transition to a high state errantly due to the loss of a low state at node X caused by an above-supply coupling (not shown).

To solve this type of problem, many designers have resorted to adding buffering circuits at the input of the latch circuit, typically using inverters. Although effective, this solution has the adverse effect of inserting additional delay into the latch circuit. For example, to preserve the state of the output signal in FIG. 1, two inverters would have to be added in the path from the data input to the output. In that case, the delay through the circuit would be three inverters plus a transmission gate (created by transistors 118 and 119) versus only one inverter and a transmission gate as in FIG. 1. Another way to solve the noise coupling problem is to eliminate any potential noise coupling problem onto the data input signal. This solution involves the removal of any signal wire that is adjacent to the data input. Although this is also a very effective technique, problems in wiring critical areas prevents this technique from being a universal solution. Consequently, there exists a need to prevent those noise coupling events from causing the loss of state in a latch circuit.

In accordance with a preferred embodiment of the present invention, a noise suppression circuit is added to a latch circuit. The noise suppression circuit can continually monitor the circuit condition of the latch circuit and automatically provide a correction to a noise problem when necessary. The noise suppression circuits can suppress noise by adding transistors to the overall system.

For example, as was shown in U.S. patent application Ser. No. 09/282,269, FIG. 3 illustrates such a design for below-ground noise, and FIG. 4 shows such a design for above-supply noise.

Figure 3:
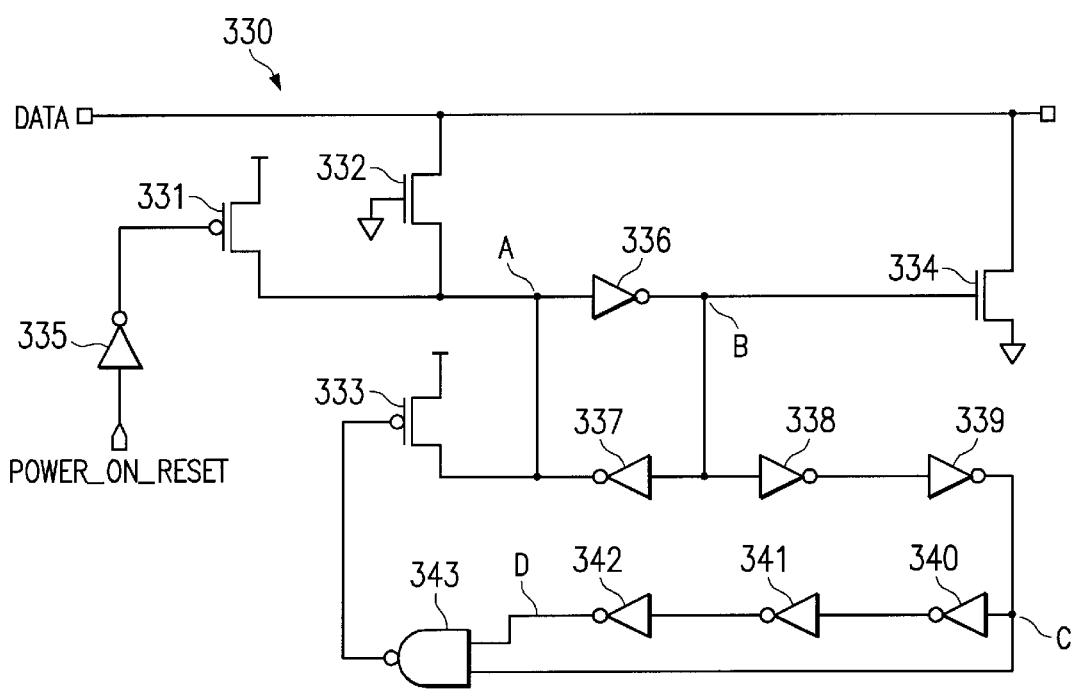
FIG. 3 is a circuit diagram of a noise suppression circuit for suppressing below-ground noise.
Figure 4:
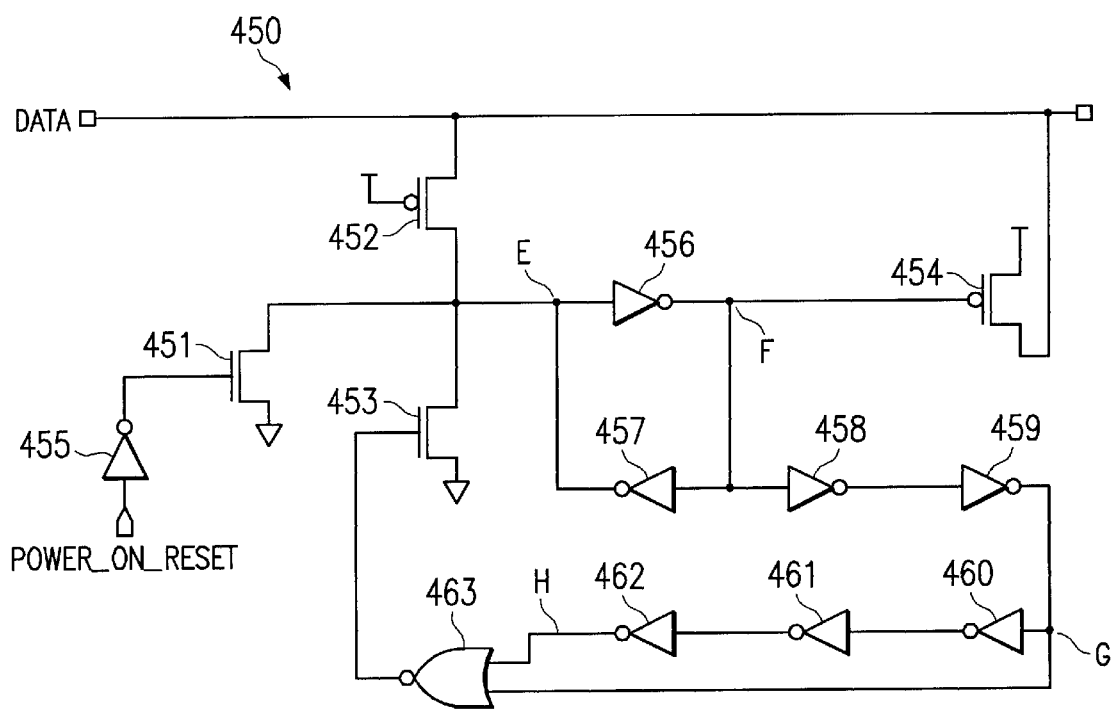
FIG. 4 is a circuit diagram of a noise suppression circuit for suppressing above-power supply noise.

With reference now to FIG. 3, a circuit diagram illustrates a noise suppression circuit for suppressing below-ground noise. As shown, a noise suppression circuit 330 is constructed with a latch similar to latch circuit 110 of FIG. 1, except noise suppression circuit 330 includes a power-on-reset signal along with a p-channel transistor 331 and inverter 335 for presetting an internal latch to a logical "1" state. A clamping n-channel transistor 334 is also included to restore the state of the data input of the circuit being protected after the occurrence of a noise coupling event. Furthermore, a feedback system is included to turn off clamping n-channel transistor 334 and to restore the high state of the circuit being protected after a predetermined amount of time, e.g., 1 ns, using inverters 338–342, a two-input NAND gate 343, and a p-channel transistor 333.

Initially, the power-on-reset signal is pulsed high when noise suppression circuit 330 is powered on. The technique for generating such a signal pulse is well-known to those skilled in the relevant art. The power-on-reset pulse sets node A to a high state via a p-channel transistor 332.

Node B then transitions low due to the operation of an inverter 336. A feedback inverter 337 then drives node A to a high state again such that the high state at node A is retained. Because node B is low, n-channel transistor 334 is turned off, and current is prevented from flowing through transistor 334 to ground. In addition, inverters 338 and 339 force node C to a low state because node B is at a low state. Because node C is at a low state, inverters 340–342 set node D to a high state. Because NAND gate 343 now receives a low state from node C and a high state from node D, the output of NAND gate 343 is high. As a result, p-channel transistor 333 is turned off.

When noise from a signal line adjacent to the data input, such as signal line 120 from FIG. 1, couples to the data input with sufficient amplitude below ground (i.e., a threshold voltage of an n-channel transistor as determined by the process technology), n-channel transistor 332 receives a voltage between its gate (tied to ground) and its source (tied to the data input) greater than or equal to its threshold voltage. If this voltage is of sufficient duration in terms of pulse width, node A will transition from a high state to a low state. When node A goes to a low state, inverter 336 causes node B to go to a high state. When node B is at a high state, n-channel transistor 334 turns on and returns the data input back to ground (from its below ground starting point). As a result, the duration of the noise pulse on the data input will be reduced significantly. Compared to the unprotected data input in FIG. 1, a protected data input using noise suppression circuit 330 of FIG. 3 returns to ground in a much shorter time. Transistor 334 remains on until the latch formed by inverters 336 and 337 is reset to a high value, which forces node A to a high state and node B at a low state.

When node B goes to a high state, inverters 338–339 force node C high after a slight delay. This delay is introduced to prevent the latch (i.e., inverters 336 and 337) from resetting too quickly. This is because if the latch resets immediately, then transistor 334 will be turned on only very briefly, and its effectiveness at drawing the data input back to ground will be reduced. When node C is at a high state, NAND gate 343 briefly receives a high state on both node C and node D, causing the output pulse from NAND gate 343 to go to a low state. Note that the output pulse from NAND gate 343 will be low only until node D goes low via inverters 340–342 in response to node C being high. Thus, NAND gate 343 and inverters 340–342 form a rising-edge-triggered one-shot pulse generator with a pulse duration equal to the delay through inverters 340–342.

Furthermore, when the output pulse from NAND gate 343 turns on transistor 333, node A is forced to be high again. Thus, node B becomes low via inverter 336, and inverter 337 holds the high state at node A. Transistor 334 is now turned off, ending the noise attenuation on the data input. Note that the amount of time transistor 334 should be turned on is determined by the response time through inverters 336, 338, 339, NAND gate 343, and transistor 333. Node C is now also forced low, later forcing node D high. NAND gate 343 now receives a high and a low value, and no pulse is generated because NAND gate 343 never receives a high value on both inputs at this time. At this time, noise suppression circuit 330 of FIG. 3 is ready to suppress other below ground noise coupling events again.

There are several important aspects regarding the construction of noise suppression circuit 330. First, the omission of a p-channel transistor in the clocked transmission gate (as in transistor 118 in FIG. 1) is intentional. Because the transmission gate is turned off and the loss of a high state is being detected, the p-channel transistor is not necessary. Additionally, inverters 340–342, in conjunction with NAND gate 343 form a rising-edge-triggered one-shot pulse generator. Inverters 338 and 339 serve to delay the signal into the one-shot pulse generation to prevent the restoration of the latch to a high state too quickly, as mentioned previously.

Figure 2E:
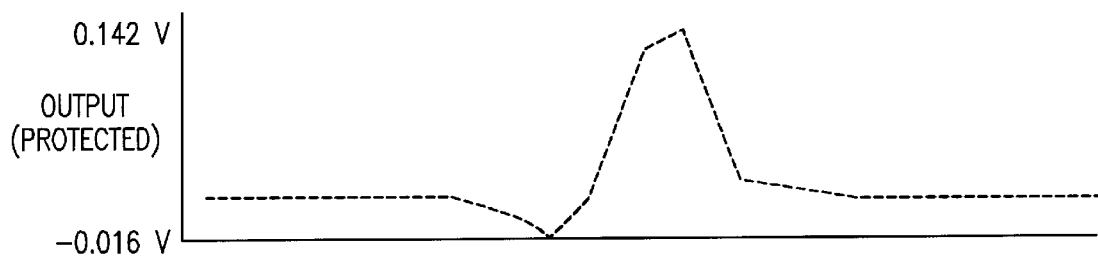

Referring back to FIGS. 2A–2E, FIG. 2E is the output waveform of a latch circuit 110 from FIG. 1 having its data input connected to noise suppression circuit 330. When comparing the unprotected data input, shown in FIG. 2B, to the protected node, shown in FIG. 2D, the unprotected data input drops to −1.093 V due to below-ground noise while the protected node also drops to −0.916 V, which is not that much of a difference. This means that the amplitude of the noise coupling event is not significantly affected. However, note that the recovery time of the noise coupling event is much less. That is, the resulting rising slew rate of the protected data input is much higher than the unprotected input. This means that the energy contained in the noise event in the data input to the protected circuit is much less, thereby reducing the probability of failure. This can be seen as the output of the protected circuit rises to only 0.142 V due to the noise coupling event but quickly retains the low state on the output, as shown in FIG. 2E. On the other hand, the output of the unprotected latch switches to the full supply voltage, as shown in FIG. 2C, and the latched state is lost as a result.

With reference now to FIG. 4, a circuit diagram illustrates a noise suppression circuit for suppressing above-power-supply noises. Noise suppression circuit 450 is similar to noise suppression circuit 330 of FIG. 3 and operates as follows. During power up, power-on-reset input 455 is pulsed high, which turns on an n-channel transistor 451. This pulls node E to a low state and sets node F to a high state via inverter 456, and inverter 457 maintains node E in a low state. Node G is in a high state via inverters 458–459, and node H is in a low state via inverters 460–462. As a result, p-channel transistor 454 is turned off. NOR gate 463 receives a high input, so the output from NOR gate 463 is low, keeping n-channel transistor 453 off.

If an above-supply noise event occurs on the data input and is greater than the threshold of p-channel transistor 452 (as determined by the process technology), p-channel transistor 452 will be turned on, pulling node E to a high state. The high state of node E then forces node F to a low state, turning p-channel transistor 454 on, which draws the data input back to the supply voltage level. In addition, the low state of node F causes node G to go to a low state. NOR gate 462 receives two low values for a brief time, or until node H is forced to a high state due to node G being in a low state. Thus, the pulse from NOR gate 463 will pulse high for a short amount of time, forcing node E to a low state. The low state of node E causes node F to go to a high state, turning off transistor 454. Also, the high state of node F causes node G to be at a high state, which later causes node H to be in a low state. Because NOR gate 463 does not receive two high values, the output from NOR gate 463 remains in a low state. At this point, noise suppression circuit 440 is ready to suppress other above-supply noise coupled events.

Referring to FIG. 3 and FIG. 4, it is evident that the overall transistor count is quite large (24 transistors for FIG. 3 and 26 transistors for FIG. 4). Although the circuit will suppress noise, the device count adds significant area. This area increase can be costly in some applications. Consequently, there exists a need to provide the function of the circuits of FIG. 3 and FIG. 4 at a reduced area cost.

Figure 5:
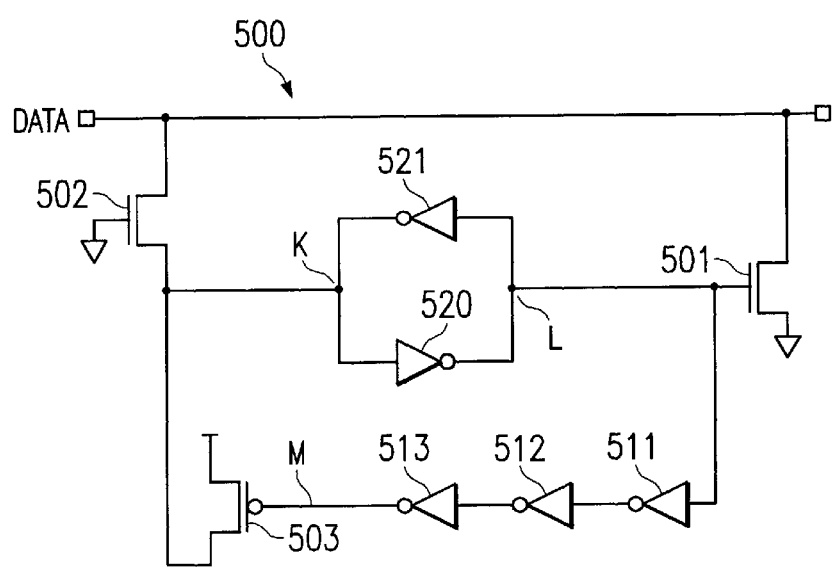
FIG. 5 is a first type of reduced area below-ground noise suppression circuit in accordance with a preferred embodiment of the present invention.

With reference now to FIG. 5, a first type of reduced area below-ground noise suppression circuit is depicted in accordance with a preferred embodiment of the present invention. This circuit is built using a framework similar to the framework shown in FIG. 3 but with the advantage of less devices.

Noise suppression circuit 500 has an internal latch with the ability to be automatically preset to a logical "1" state upon power-on. A clamping n-channel transistor 501 is also included to restore the state of the data input being protected by the circuit after the occurrence of a noise coupling event. Furthermore, a feedback system is included to turn off clamping n-channel transistor 501 and to restore the high state of the internal latch after a predetermined amount of time, e.g., 250 ps, using inverters 511–513 and p-channel transistor 503.

Initially, before power-on, all nodes of noise suppression circuit 500 are at a low state. Upon power-on, because node M is at a low state, p-channel transistor 503 turns on and sets node K to a high state. The gate of n-channel transistor 502 is tied to ground and is turned off. Node L then transitions low due to the operation of inverter 520. A feedback inverter 521 then drives node K to a high state again such that the high state at node K is retained. Because node L is low, n-channel transistor 501 is turned off, and current is prevented from flowing through transistor 501 to ground. In addition, inverters 511–513 set node M to a high state, and p-channel transistor 503 turns off.

In operation, circuit 500 reacts to noise in the data input signal in the fashion similar to circuit 330 in FIG. 3. When noise from a signal line adjacent to the data input signal, such as signal line 120 in FIG. 1, couples to the data input with sufficient amplitude below ground (i.e., a threshold voltage of an n-channel transistor as determined by the process technology), n-channel transistor 502 receives a voltage between its gate (which is tied to ground) and its source (which is tied to the data input) greater than or equal to its threshold voltage. If this voltage is of sufficient duration in terms of pulse width, node K will transition from a high state to a low state. When node K goes to a low state, inverter 520 causes node L to go to a high state. When node L is at a high state, n-channel transistor 501 turns on and returns the data input back to ground (from its below ground starting point). As a result, the duration of the noise pulse on the data input will be reduced significantly. Compared to the unprotected data input in FIG. 1, a protected data input using noise suppression circuit 500 returns to ground in a much shorter time. Transistor 501 remains on until the latch formed by inverters 520 and 521 is reset to a high value, which forces node K to a high state and node L to a low state.

When node L goes to a high state, inverters 511–513 force node M to a low state after a slight delay. This delay is introduced to prevent the latch (i.e., inverters 520 and 521) from resetting too quickly. This is because if the latch resets immediately, then transistor 501 will be turned on only very briefly, and its effectiveness at drawing the data input back to ground will be reduced.

When node M transitions to a low state, p-channel transistor 503 turns on, and node K is forced to be high again. Thus, node L becomes low via inverter 520, and inverter 521 holds the high state at node K. N-channel transistor 501 is now turned off, ending the noise attenuation on the data input. Note that the amount of time transistor 501 should be turned on is determined by the response time through inverters 520 and 511–513 and p-channel transistor 503. With node L in a low state, node M is then forced high, and p-channel transistor 503 is turned off. Noise suppression circuit 500 is then ready to suppress other below-ground noise coupling events again. Hence, the time parameters for the response and recovery time of the circuit is programmable, predeterminable, or preconfigurable depending on the physical characteristics of the active devices.

There are several important aspects regarding the construction of noise suppression circuit 500. First, the power-on-reset circuitry and the rising-edge-triggered one-shot pulse generator of FIG. 3 are not needed due to the nature of the circuit. In the first case, the circuit will always revert to the necessary state of the internal latch being high when voltage is applied. For example, if node K is initially high, then node L is low and node M is high, which readies the circuit to sense noise events. If, though, node K is initially low, then node L will be high, forcing node M to be low, which will force node K to be high. Thus, the circuit will always set itself to the necessary state to sense noise without the power-on-reset circuitry and the rising-edge-triggered one-shot pulse generator of FIG. 3. Additionally, the circuit of FIG. 5 is smaller than that of FIG. 3 by removing three inverters, a NAND gate, and a p-channel device. When used in a system, the circuit of FIG. 5 will eliminate the failure mode shown with respect to FIGS. 2A–2C.

With reference now to FIGS. 6A–6D, waveform diagrams depict simulation results for various nodes shown in the circuit of FIG. 5.

Figure 6A:
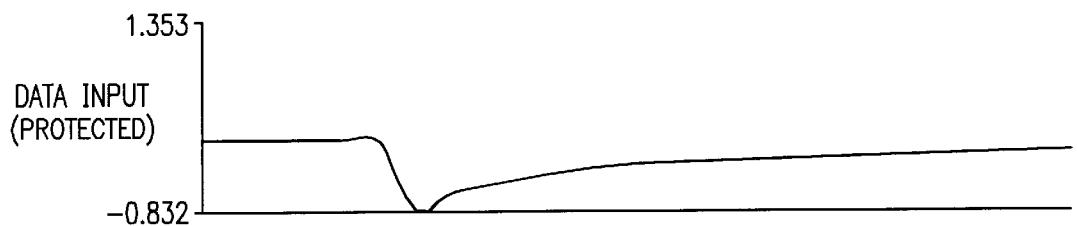
FIGS. 6A–6D are waveform diagrams depicting simulation results for various nodes shown in the circuit of FIG. 5.
Figure 6B:
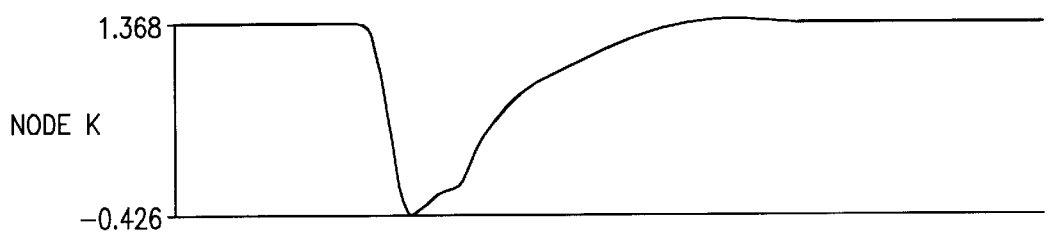
Figure 6C:
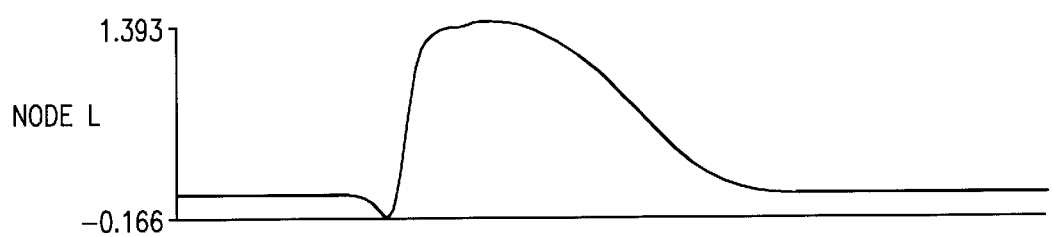
Figure 6D:

With reference now to FIGS. 6A–6D, waveform diagrams depict simulation results for various nodes shown in the circuit of FIG. 5. FIG. 6A represents a protected data input that returns to ground relatively quickly after bouncing below ground due to a noise coupling effect. FIG. 6B represents node K transitioning from its normal high state to a below-ground state, due to below-ground noise coupling, and back to its normal high state. FIG. 6C represents node L transitioning from its low state to a high state and back to a low state in a manner inversely related with the transitions shown in FIG. 6B for node K. FIG. 6D represents node M transitioning from its normal high state to a low state and back to a high state.

Figure 7A:
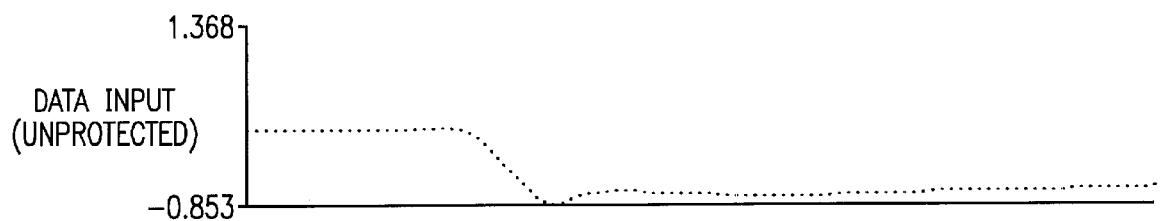
FIGS. 7A–7D are waveform diagrams depicting simulation results of protected and unprotected signals for the circuit in FIG. 5.
Figure 7B:
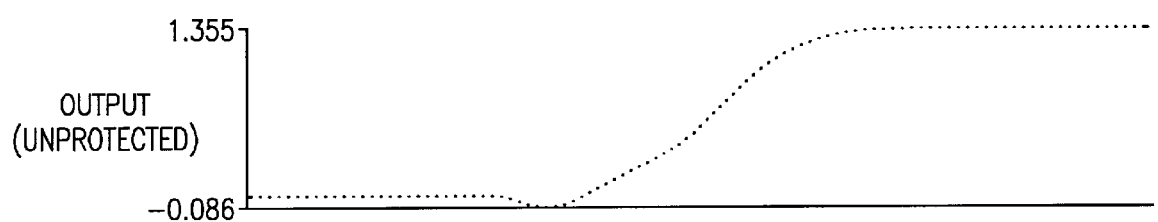
Figure 7C:
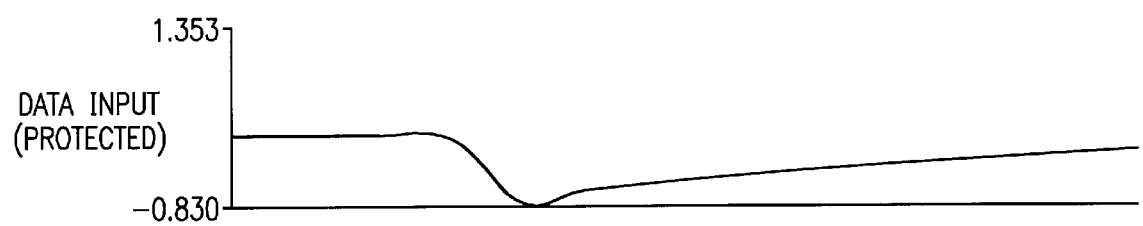
Figure 7D:
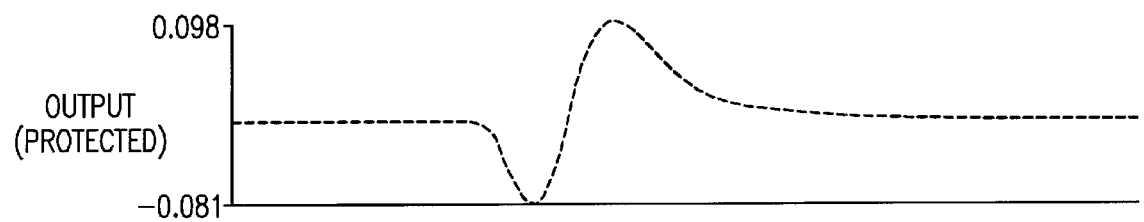

With reference now to FIGS. 7A–7D, waveform diagrams depict simulation results of protected and unprotected signals for the circuit in FIG. 5. When a coupling signal switches to a low state, an unprotected data input may bounce below ground, as shown in FIG. 7A, and the corresponding output would transition to a high state errantly, as shown in FIG. 7B, due to the loss of the high state stored in the latch circuit, such as node K. FIG. 7C and FIG. 7D represent a protected data input and a protected output, respectively, using the noise suppression circuit of FIG. 5. Note that although both inputs bounce below ground significantly, the protected input returns to ground much quicker. This means that the protected output does not switch, i.e. lose its state, as in the unprotected case but does show a small amount of propagated noise, in this case 98 mV.

Figure 8:
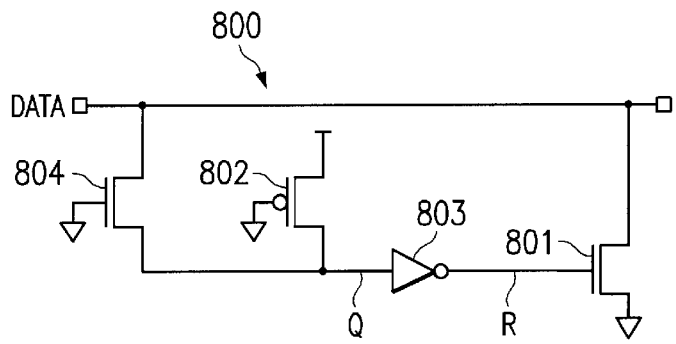
FIG. 8 is a second type of reduced area below-ground noise suppression circuit in accordance with a preferred embodiment of the present invention.

A further simplification to the circuits of FIG. 3 and FIG. 5 can be made to reduce more area by using a very weak, always-on feedback device instead of the resetting circuitry, as shown in FIG. 8.

With reference now to FIG. 8, a second type of reduced area below-ground active noise suppression circuit is depicted in accordance with a preferred embodiment of the present invention. The noise suppression circuit of FIG. 8 generally operates in a manner similar to the noise suppression circuit 500 in FIG. 5 and is smaller than noise suppression circuit 500 by four inverters.

Noise suppression circuit 800 has clamping n-channel transistor 801 to restore the state of the data input being protected by the circuit after the occurrence of a noise coupling event. Because the gate of p-channel transistor 802 is tied to ground, transistor 802 is always on. Hence, node Q is always preset high, which forces node R low via inverter 803. When node R is low, n-channel transistor 801 is turned off.

When a below-ground noise event on the data input occurs, node Q is pulled low because n-channel transistor 804 turns on and p-channel transistor 802 is extremely weak. This causes node R to go high, turning on n-channel transistor 801, helping to pull the data input back to ground. When the noise event is over, p-channel transistor 802 restores node Q to a high state, causing node R to fall back to a low state.

However, it should be noted that although noise suppression circuit 800 is much smaller than noise suppression circuit 500 shown in FIG. 5, noise suppression circuit 800 requires the consideration of other design parameters. Always-active-feedback p-channel transistor 802 should be extremely weak, which may be created by using longer-than-minimum channel devices. Although this may introduce a device-tracking problem versus n-channel transistor 804, one can fabricate the circuit so that the appropriate operating ranges are obtained. Inverter 803 should be designed with a high switching point to guarantee the drop on node Q is recognized as a logical zero, and the power supply should be relatively noise free. The duration of the noise cancellation time is programmable, preconfigurable, or predeterminable. In FIG. 5, using the inverter delay chain of inverters 511–513 and feedback p-channel device 503, the duration of the cancellation event can be widely varied to suit the particular environment. However, noise suppression circuit 800 relies on the strength of p-channel transistor 802 for reset. Hence, the time is preconfigurable depending on the physical characteristics of the active devices.

Figure 9A:
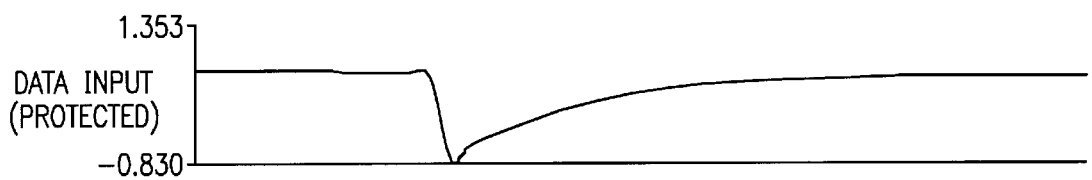
FIGS. 9A–9C are waveform diagrams depicting simulation results for various nodes shown in the circuit of FIG. 8.
Figure 9B:
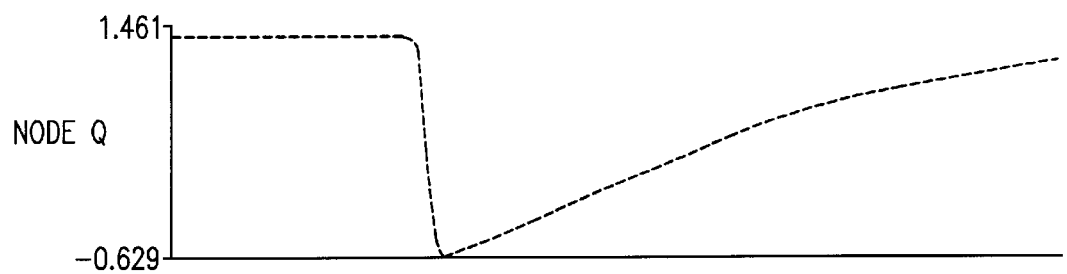
Figure 9C:
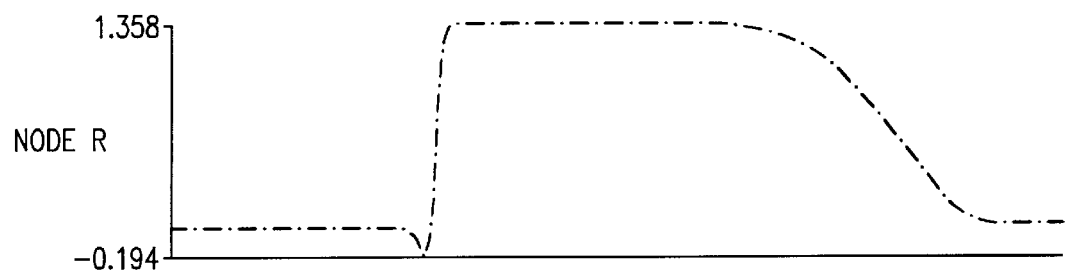

With reference now to FIGS. 9A–9C, waveform diagrams depict simulation results for various nodes shown in the circuit of FIG. 8.

FIG. 9A represents a protected data input that returns to ground relatively quickly after bouncing below ground due to a noise coupling effect. FIG. 9B represents node Q transitioning from its normal high state to a below-ground state, due to below-ground noise coupling, and being pulled back to its normal high state by p-channel transistor 802. FIG. 9C represents node R transitioning from its low state to a high state and back to a low state in a manner inversely related with the transitions shown in FIG. 9B for node Q.

Similar to the reduced area below-ground noise suppression circuits of FIG. 5 and FIG. 8, FIG. 10 and FIG. 11 show parallel reduced area noise suppression circuits for above-supply noise.

Figure 10:
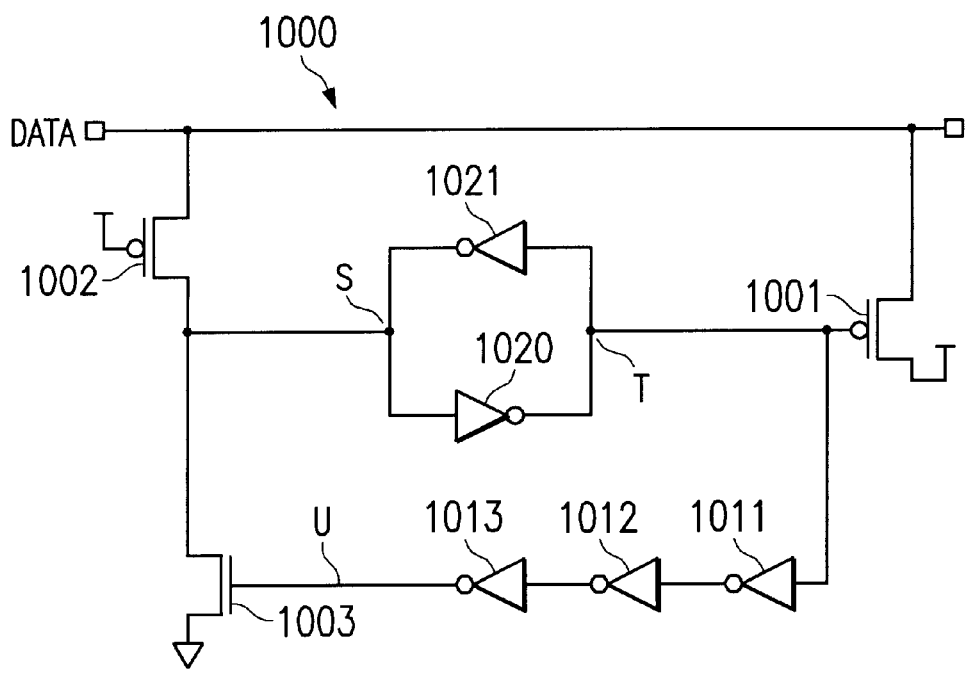
FIG. 10 is a circuit diagram illustrating a first type of reduced area above-supply active noise suppression circuit in accordance with a preferred embodiment of the present invention.

With reference now to FIG. 10, a circuit diagram illustrates a first type of reduced area above-supply active noise suppression circuit in accordance with a preferred embodiment of the present invention. This circuit is built using a framework similar to the framework shown in FIG. 4 but with the advantage of less devices.

Noise suppression circuit 1000 has an internal latch which maintains a low state at node S. During power up, p-channel transistor 1002 has its gate tied to the supply voltage level, so transistor 1002 turns off. Node S is at a low state, so node T is at a high state via inverter 1020, and feedback inverter 1021 maintains node S in a low state. Because node T is in a high state, p-channel transistor 1001 is turned off. Node U is in a low state via inverters 1011–1013, and as a result, n-channel transistor 1003 is turned off.

If an above-supply noise event occurs on the data input and is greater than the threshold of p-channel transistor 1002 (as determined by the process technology), p-channel transistor 1002 will be turned on, pulling node S to a high state. The high state of node S then forces node T to a low state, turning on p-channel transistor 1001, which draws the data input back to the supply voltage level. In addition, the low state of node T causes node U to go to a high state, which turns on n-channel transistor 1003. Node S is forced to a low state. The low state of node S causes node T to go to a high state, turning off p-channel transistor 1001. Also, the high state of node T causes node U to transition to a low state, which turns off n-channel transistor 1003. At this point, noise suppression circuit 1000 is ready to suppress other above-supply noise coupled events.

Figure 11:
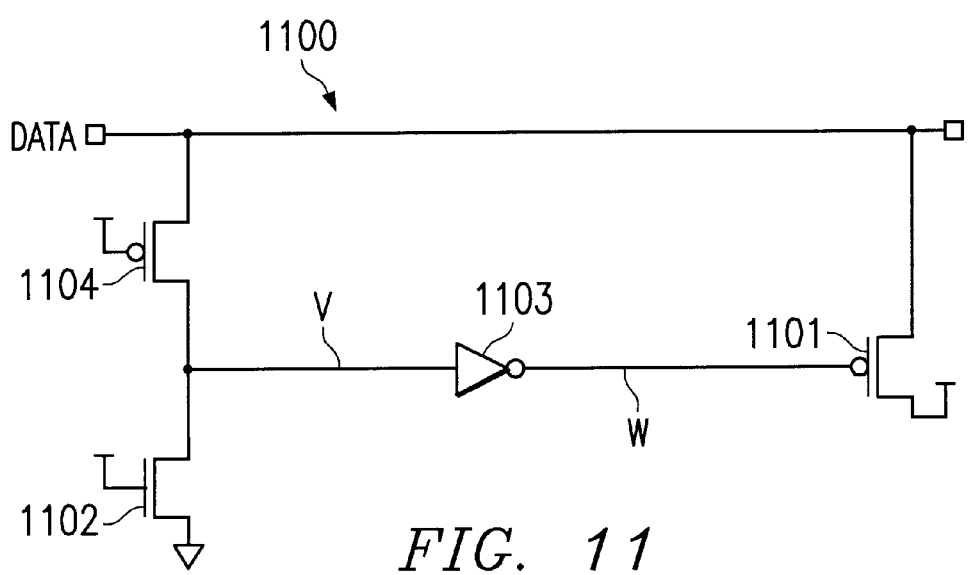
FIG. 11 is a circuit diagram illustrating a second type of reduced area above-supply active noise suppression circuit in accordance with a preferred embodiment of the present invention.

With reference now to FIG. 11, a circuit diagram illustrates a second type of reduced area above-supply active noise suppression circuit in accordance with a preferred embodiment of the present invention.

Noise suppression circuit 1100 has transistor 1101 to restore the state of the data input being protected by the circuit after the occurrence of a noise coupling event. Because the gate of n-channel transistor 1102 is tied to the supply voltage, transistor 1102 is always on. Hence, node V is always preset low, which forces node W high via inverter 1103. When node W is high, p-channel transistor 1101 is turned off.

When an above-supply noise event on the data input occurs, node V is pulled high because p-channel transistor 1104 turns on. This causes node W to go low, turning on p-channel transistor 1101, helping to pull the data input back to the supply voltage. When the noise event is over, n-channel transistor 1102 restores node V to a low state, causing node W to transition back to a high state and turning off n-channel transistor 1101.

The advantages of the present invention should be apparent in light of the detailed description of the invention provided above. Four new active noise suppression circuits, two each for below-ground noise events and above-supply noise events, have been disclosed that consume less area than the circuits shown in FIG. 3 and FIG. 4. These new circuits, as shown in FIG. 5 and FIG. 8, or alternatively, in FIG. 10 and FIG. 11, reduce the device count by approximately 11 and 19 active devices, respectively, or 46% and 79%, compared with the circuits shown in FIG. 3 and FIG. 4. As in the circuits in FIG. 3 and FIG. 4, the circuits of the present invention are useful in conjunction with latch elements where both speed and wiring is at a critical point in a particular design/path. All circuits load the associated lines with only two small diffusion capacitances.

As has been described, the present invention provides an active noise suppression circuit for below-ground noises and an active noise suppression circuit for above-power-supply noises. Both noise suppression circuits can work in conjunction with each other and an associated data input line will only be loaded with two small diffusion capacitances. Although a latch circuit is used to illustrate the present invention, both noise suppression circuits are applicable to any type of circuit in which a state needs to be maintained in the presence of noise.

The description of the present invention has been presented for purposes of illustration and description, but is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A noise suppression circuit comprising:
   an internal latch;
   presetting means for automatically presetting said internal latch to a predetermined state upon applying power to the noise suppression circuit;
   a clamping transistor for restoring, after an occurrence of a noise event, the state of a data input to which the noise suppression circuit is providing protection; and
   a feedback circuit, coupled between the presetting means and the clamping transistor, for turning off the clamping transistor after a predetermined amount of time.

2. The noise suppression circuit according to claim 1, wherein the predetermined state is a logical high state.

3. The noise suppression circuit according to claim 1, wherein the predetermined state is a logical low state.

4. The noise suppression circuit according to claim 1, wherein the internal latch includes two inverters.

5. The noise suppression circuit according to claim 1, wherein the internal latch includes an always-active transistor for returning the internal latch to the predetermined state after a predetermined amount of time.

6. The noise suppression circuit according to claim 1, wherein the presetting means includes a p-channel transistor that sets the internal latch to the predetermined state and that is turned off by the feedback circuit after a predetermined amount of time.

7. The noise suppression circuit according to claim 1, wherein the presetting means sets the internal latch to a low state.

8. The noise suppression circuit according to claim 1, wherein the clamping transistor is an n-channel transistor for suppressing below-ground noises.

9. The noise suppression circuit according to claim 1, wherein the feedback circuit includes a plurality of inverters and a p-channel transistor for suppressing below-ground noises.

10. The noise suppression circuit according to claim 1, wherein the clamping transistor is an p-channel transistor for suppressing above-power-supply noises.

11. The noise suppression circuit according to claim 1, wherein the feedback circuit includes a plurality of inverters and an n-channel transistor for suppressing above-power-supply noises.

12. The noise suppression circuit of claim 1 wherein the predetermined amount of time is configurable based upon the physical characteristics of components in the noise suppression circuit.

13. A noise suppression circuit comprising:

an internal latch;

a clamping transistor for restoring, after an occurrence of a noise event, the state of a data input to which the noise suppression circuit is providing protection; and a feedback circuit, coupled between the internal latch and the clamping transistor, for turning off the clamping transistor after a predetermined amount of time.

14. The noise suppression circuit according to claim 13, wherein the internal latch includes presetting means for automatically presetting said internal latch to a predetermined state upon applying power to the noise suppression circuit.

15. The noise suppression circuit according to claim 13, wherein the internal latch includes an always-active transistor for automatically presetting said internal latch to a predetermined state upon applying power to the noise suppression circuit.

16. The noise suppression circuit according to claim 13, wherein the internal latch includes resetting means for automatically resetting the internal latch to a predetermined state following the noise event.

17. The noise suppression circuit according to claim 13, wherein the internal latch includes an always-active transistor for automatically resetting the internal latch to a predetermined state following the noise event.

18. The noise suppression circuit according to claim 13, wherein the internal latch includes a p-channel transistor for transitioning the predetermined state of the internal latch to a logical high state following an above-power-supply noise event.

19. The noise suppression circuit according to claim 13, wherein the internal latch includes an n-channel transistor for transitioning the predetermined state of the internal latch to a logical low state following a below-ground noise event.

20. The noise suppression circuit of claim 13, wherein the predetermined amount of time is configurable based upon the physical characteristics of components in the noise suppression circuit.

21. A noise suppression circuit comprising:

a triggering transistor, wherein the triggering transistor transitions a predetermined state of the noise suppression circuit to an opposing logic state after an occurrence of a noise event;

a clamping transistor, wherein the clamping transistor restores, after the occurrence of a noise event, the state of a data input to which the noise suppression circuit is providing protection;

a feedback inverter, coupled between the triggering transistor and the clamping transistor, wherein the feedback inverter turns off the clamping transistor after a predetermined amount of time; and an always-active transistor.

22. The noise suppression circuit of claim 21 wherein the always-active transistor automatically presets the noise suppression circuit to a predetermined state upon applying power to the noise suppression circuit.

23. The noise suppression circuit of claim 21 wherein the always-active transistor automatically resets the noise suppression circuit to a predetermined state after a predetermined amount of time.

24. The noise suppression circuit of claim 21 wherein the predetermined amount of time is configurable based upon the physical characteristics of components in the noise suppression circuit.

25. A noise suppression circuit comprising:

an first n-channel transistor whose gate is tied to ground, whose drain is tied to a data input signal, and whose source is tied to an input of an inverter;

an inverter whose input is tied to the source of the first n-channel transistor and whose output is tied to a gate of a second n-channel transistor;

a second n-channel transistor whose gate is tied to the output of the inverter, whose drain is tied to ground, and whose source is tied to the data input signal; and a p-channel transistor whose gate is tied to ground, whose drain is tied to a reference voltage, and whose source is tied to the input of the inverter.

26. A noise suppression circuit comprising:

an first p-channel transistor whose gate is tied to a reference voltage, whose drain is tied to an input of an inverter, and whose source is tied to a data input signal;

an inverter whose input is tied to the source of the first p-channel transistor and whose output is tied to a gate of a second p-channel transistor;

a second p-channel transistor whose gate is tied to the output of the inverter, whose drain is tied to a reference voltage, and whose source is tied to the data input signal; and an n-channel transistor whose gate is tied to a reference voltage, whose drain is tied to ground, and whose source is tied to the input of the inverter.

* * * * *